United States Patent
Ahn et al.

(10) Patent No.: US 8,847,334 B2
(45) Date of Patent: *Sep. 30, 2014

(54) METHOD OF FORMING LUTETIUM AND LANTHANUM DIELECTRIC STRUCTURES

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 357 days.

This patent is subject to a terminal disclaimer.

(21) Appl. No.: 13/310,245

(22) Filed: Dec. 2, 2011

(65) Prior Publication Data

US 2012/0074480 A1    Mar. 29, 2012

Related U.S. Application Data

(60) Continuation of application No. 12/837,303, filed on Jul. 15, 2010, now Pat. No. 8,071,443, which is a division of application No. 11/823,727, filed on Jun. 28, 2007, now Pat. No. 7,759,237.

(51) Int. Cl.
  *H01L 29/76*    (2006.01)
  *C23C 16/455*   (2006.01)
  *H01L 21/02*    (2006.01)
  *H01L 21/314*   (2006.01)
  *B82Y 10/00*    (2011.01)
  *H01L 21/28*    (2006.01)
  *C23C 16/40*    (2006.01)

(52) U.S. Cl.
  CPC .... *H01L 21/28273* (2013.01); *C23C 16/45525* (2013.01); *H01L 21/0228* (2013.01); *H01L 21/3142* (2013.01); *H01L 21/02178* (2013.01); *B82Y 10/00* (2013.01); *H01L 21/02194* (2013.01); *H01L 21/02192* (2013.01); *C23C 16/40* (2013.01); *H01L 21/022* (2013.01)
  USPC .......................................... 257/411; 257/410

(58) Field of Classification Search
  CPC .... H01L 29/517; H01L 29/512; H01L 29/511
  USPC ........... 257/406, 410, 411; 438/201, 206, 591
  See application file for complete search history.

(56) References Cited

U.S. PATENT DOCUMENTS

| | | |
|---|---|---|
| 5,274,249 A | 12/1993 | Xi et al. |
| 5,840,897 A | 11/1998 | Kirlin et al. |

(Continued)

FOREIGN PATENT DOCUMENTS

| | | |
|---|---|---|
| EP | 1096042 A1 | 5/2001 |
| EP | 1122795 A2 | 8/2001 |

(Continued)

OTHER PUBLICATIONS

"Improved Metallurgy for Wiring Very Large Scale Integrated Circuits", International Technology Disclosures, 4, Abstract, (1986), 1 page.

(Continued)

*Primary Examiner* — Quoc Hoang
(74) *Attorney, Agent, or Firm* — Schwegman Lundberg & Woessner, P.A.

(57) ABSTRACT

Methods of forming dielectric structures are shown. Methods of forming dielectric structures are shown that include lutetium oxide and lanthanum aluminum oxide crystals embedded within the lutetium oxide. Specific methods shown include monolayer deposition which yields process improvements such as chemistry control, step coverage, crystallinity/microstructure control.

17 Claims, 4 Drawing Sheets

(56) References Cited

U.S. PATENT DOCUMENTS

| | | | |
|---|---|---|---|
| 5,852,306 A | 12/1998 | Forbes | |
| 5,923,056 A | 7/1999 | Lee et al. | |
| 5,981,350 A | 11/1999 | Geusic et al. | |
| 6,025,225 A | 2/2000 | Forbes et al. | |
| 6,057,271 A | 5/2000 | Kenjiro et al. | |
| 6,090,636 A | 7/2000 | Geusic et al. | |
| 6,110,529 A | 8/2000 | Gardiner et al. | |
| 6,134,175 A | 10/2000 | Forbes et al. | |
| 6,150,188 A | 11/2000 | Geusic et al. | |
| 6,191,448 B1 | 2/2001 | Forbes et al. | |
| 6,198,168 B1 | 3/2001 | Geusic et al. | |
| 6,203,613 B1 | 3/2001 | Gates et al. | |
| 6,300,193 B1 | 10/2001 | Forbes | |
| 6,317,357 B1 | 11/2001 | Forbes | |
| 6,365,470 B1 | 4/2002 | Maeda | |
| 6,380,579 B1 | 4/2002 | Nam et al. | |
| 6,381,168 B2 | 4/2002 | Forbes | |
| 6,399,979 B1 | 6/2002 | Noble et al. | |
| 6,407,424 B2 | 6/2002 | Forbes | |
| 6,418,050 B2 | 7/2002 | Forbes | |
| 6,429,065 B2 | 8/2002 | Forbes | |
| 6,432,779 B1 | 8/2002 | Hobbs et al. | |
| 6,434,041 B2 | 8/2002 | Forbes et al. | |
| 6,445,023 B1 | 9/2002 | Vaartstra et al. | |
| 6,454,912 B1 | 9/2002 | Ahn et al. | |
| 6,458,701 B1 | 10/2002 | Chae et al. | |
| 6,465,298 B2 | 10/2002 | Forbes et al. | |
| 6,476,434 B1 | 11/2002 | Noble et al. | |
| 6,486,027 B1 | 11/2002 | Noble et al. | |
| 6,486,703 B2 | 11/2002 | Noble et al. | |
| 6,492,233 B2 | 12/2002 | Forbes et al. | |
| 6,495,436 B2 | 12/2002 | Ahn et al. | |
| 6,498,065 B1 | 12/2002 | Forbes et al. | |
| 6,515,510 B2 | 2/2003 | Noble et al. | |
| 6,518,615 B1 | 2/2003 | Geusic et al. | |
| 6,526,191 B1 | 2/2003 | Geusic et al. | |
| 6,538,330 B1 | 3/2003 | Forbes | |
| 6,541,280 B2 | 4/2003 | Kaushik et al. | |
| 6,574,144 B2 | 6/2003 | Forbes | |
| 6,597,037 B1 | 7/2003 | Forbes et al. | |
| 6,642,573 B1 | 11/2003 | Halliyal et al. | |
| 6,689,660 B1 | 2/2004 | Noble et al. | |
| 6,709,978 B2 | 3/2004 | Geusic et al. | |
| 6,723,577 B1 | 4/2004 | Geusic et al. | |
| 6,754,108 B2 | 6/2004 | Forbes | |
| 6,764,901 B2 | 7/2004 | Noble | |
| 6,777,715 B1 | 8/2004 | Geusic et al. | |
| 6,778,441 B2 | 8/2004 | Forbes et al. | |
| 6,787,370 B2 | 9/2004 | Forbes | |
| 6,804,136 B2 | 10/2004 | Forbes | |
| 6,812,513 B2 | 11/2004 | Geusic et al. | |
| 6,812,516 B2 | 11/2004 | Noble, Jr. et al. | |
| 6,818,937 B2 | 11/2004 | Noble et al. | |
| 6,858,120 B2 | 2/2005 | Ahn et al. | |
| 6,858,444 B2 | 2/2005 | Ahn et al. | |
| 6,888,739 B2 | 5/2005 | Forbes | |
| 6,893,984 B2 | 5/2005 | Ahn et al. | |
| 6,912,158 B2 | 6/2005 | Forbes | |
| 6,914,800 B2 | 7/2005 | Ahn et al. | |
| 7,045,430 B2 | 5/2006 | Ahn et al. | |
| 7,217,643 B2 | 5/2007 | Liang | |
| 7,494,939 B2 | 2/2009 | Ahn et al. | |
| 7,531,437 B2 | 5/2009 | Brask et al. | |
| 7,759,237 B2 | 7/2010 | Ahn et al. | |
| 8,071,443 B2 * | 12/2011 | Ahn et al. | 438/257 |
| 2001/0009695 A1 | 7/2001 | Saanila et al. | |
| 2002/0024080 A1 | 2/2002 | Derderian et al. | |
| 2002/0025628 A1 | 2/2002 | Derderian et al. | |
| 2002/0046705 A1 | 4/2002 | Sandhu et al. | |
| 2002/0086507 A1 | 7/2002 | Park et al. | |
| 2002/0089023 A1 | 7/2002 | Yu et al. | |
| 2002/0100418 A1 | 8/2002 | Sandhu et al. | |
| 2002/0102818 A1 | 8/2002 | Sandhu et al. | |
| 2002/0110991 A1 | 8/2002 | Li | |
| 2002/0146916 A1 | 10/2002 | Irino et al. | |
| 2002/0164420 A1 | 11/2002 | Derderian et al. | |
| 2002/0170671 A1 | 11/2002 | Matsushita et al. | |
| 2002/0177244 A1 | 11/2002 | Hsu et al. | |
| 2002/0192974 A1 | 12/2002 | Ahn et al. | |
| 2002/0195056 A1 | 12/2002 | Sandhu et al. | |
| 2003/0001241 A1 | 1/2003 | Chakrabarti et al. | |
| 2003/0003722 A1 | 1/2003 | Vaartstra | |
| 2003/0003730 A1 | 1/2003 | Li | |
| 2003/0027360 A1 | 2/2003 | Hsu et al. | |
| 2003/0032270 A1 | 2/2003 | Snyder et al. | |
| 2003/0207540 A1 | 11/2003 | Ahn et al. | |
| 2004/0164357 A1 | 8/2004 | Ahn et al. | |
| 2004/0219783 A1 | 11/2004 | Ahn et al. | |
| 2004/0233010 A1 | 11/2004 | Akram et al. | |
| 2005/0023595 A1 | 2/2005 | Forbes et al. | |
| 2005/0023602 A1 | 2/2005 | Forbes et al. | |
| 2005/0023603 A1 | 2/2005 | Eldridge et al. | |
| 2005/0024092 A1 | 2/2005 | Forbes | |
| 2005/0026360 A1 | 2/2005 | Geusic et al. | |
| 2005/0030825 A1 | 2/2005 | Ahn | |
| 2005/0032342 A1 | 2/2005 | Forbes et al. | |
| 2005/0164521 A1 | 7/2005 | Ahn et al. | |
| 2005/0285225 A1 | 12/2005 | Ahn et al. | |
| 2006/0046522 A1 | 3/2006 | Ahn et al. | |
| 2007/0018214 A1 | 1/2007 | Ahn | |
| 2007/0048926 A1 | 3/2007 | Ahn | |
| 2007/0049051 A1 | 3/2007 | Ahn et al. | |
| 2007/0099366 A1 | 5/2007 | Ahn et al. | |
| 2007/0158702 A1 | 7/2007 | Doczy et al. | |
| 2008/0185633 A1 | 8/2008 | Choi | |

FOREIGN PATENT DOCUMENTS

| | | |
|---|---|---|
| WO | WO-0243115 A2 | 5/2002 |
| WO | WO-2009002560 A1 | 12/2008 |

OTHER PUBLICATIONS

"Improved Metallurgy for Wiring Very Large Scale Integrated Circuits", International Technology Disclosures, vol. 4, No. 9, (1986), p. 2.

International Application Serial No. PCT/US2008/008078, Search Report and Written Opinion mailed Sep. 26, 2008, 12 pgs.

"International Technology for Semiconductor Roadmap, 1999 edition", Semiconductor Industry Association, [Online]. Retrieved from the Internet: <URL: http://public.itrs.net/Files/2001ITRS/Links/1999_SIA_Roadmap/>, (1999), 371 pgs.

"Praseodymium Oxide, Pr2O3 for Optical Coating", Technical Publication by CERAC about Praseodymium Oxide, http://www.cerac.com/pubs/proddata/pr2o3.htm, (Sep. 21, 2005), 1-2.

Alen, Petra, et al., "Atomic Layer deposition of Ta(Al)N(C) thin films using trimethylaluminum as a reducing agent", Journal of the Electrochemical Society, 148(10), (Oct. 2001), G566-G571.

Blauwe, J D, "Nanocrystal nonvolatile memory devices", IEEE Trans. Nanotechnol., (2002), 72-77.

Bonera, E., et al., "Dielectric Properties of High-k Oxides : Theory and Experiment for Lu2O3", Physical Review Letters, vol. 94, (2005), 027602-1 to 027602-4.

Booyong, S. L, et al., "Atomic Later deposition of lanthanum aluminum oxide nano-laminates for electrical applications", Journal of Applied Physics, vol. 84(20), (2004), 3957-3959.

Copel, M., et al., "Formation of a stratified lanthanum silicate dielectric by reaction with Si(001)", Applied Physics Letters, 78(11), (Mar. 12, 2001), 1607-1609.

Gougousi, Theodesia, et al., "The role of the OH species in high k polycrystalline silicon gate electrode interface reactions", Applied Physics Letters, 80(23), (Jun. 2002), 4419-4421.

Guha, S, "Atomic beam deposition of lanthanum and yttrium based oxide thin films for gate dielectrics", Applied Physics Letters, 77(17), (Oct. 23, 2000).

Guha, S, et al., "Atomic beam deposition of lanthanum-and yttrium-based oxide thin films for gate dielectrics", Applied Physics Letters, 77, (2000), 2710-2712.

Gupta, J A, et al., "Gandolinium silicate gate dielectric films with sub 1.5 nm equivalent oxide thickness", Applied Physics Letters, 78(12), (Mar. 2001), 1718-1720.

(56) References Cited

OTHER PUBLICATIONS

Hauser, J R, "Gate dielectrics for Sub-100nm CMOS", Presented at 1999 IEDM Short Course on Sub 100 nm CMOS, (1999), 64 pgs.

Jeong, Chang-Wook, "Plasma-Assisted Atomic Layer Growth of High-Quality Aluminum Oxide Thin Films", Japanese Journal of Applied Physics, Part 1: Regular Papers and Short Notes and Review Papers, 40(1), (Jan. 2001), 285-289.

Kim, C. T, et al., "Application of Al2O3 Grown by Atomic Layer Deposition to DRAM and FeRAM", International Symposium in Integrated Ferroelectrics, (Mar. 2000), 316.

Kim, Dong-Won, et al., "Memory characterization of SiGe quantum dot flash memories with HfO2 and SiO2 tunneling dielectrics", IEEE Transactions on Electron Devices, 50(9), (Sep. 2003), 1823-1829.

Kim, Y., et al., "Substrate dependence on the optical properties of Al/sub 2/O/sub 3/ films grown by atomic layer deposition", Applied Physics Letters, 71(25 ), (Dec. 22, 1997), 3604-3606.

Kukli, Kaupo, et al., "Deposition of lanthanum sulfide thin films by atomic layer epitaxy", Journal of Alloy and Compounds, 275-277, (1998), 10-14.

Kwon, Young Hae, et al., "Memory effects related to deep levels in metal-oxide semi-conductor structure with nanocrystalline Si", Applied Physics Letters, 80(14), (Apr. 8, 2002), 2502-2504.

Leskela, M, "ALD precursor chemistry: Evolution and future challenges", Journal de Physique IV (Proceedings), 9(8), (Sep. 1999), 837-852.

Marsella, Luca, et al., "Structure and stability of rare earth and transition metal oxides", Physical Review B 69, (2004), 1272103-1 to 1272103-4.

Niemien, M., et al., "Surface-Controlled growth of LaAlO3 thin films by atomic layer epitaxy", Journal of Materials Chemistry, vol. 11, (2001), 2340-2345.

Nieminen, Minna, et al., "Formation and stability of lanthanum oxide thin films deposited from B-diketonate precursor", Applied Surface Science, 174(2), (Apr. 16, 2001), 155-165.

Ohmi, S, et al., "Electrical characteristics for Lu2O3 thin films fabricated by E beam depostion method", Journal of the Electrochemical Society, 151(4), (2004), G279-G283.

Paivasaari, Jani, et al., "Synthesis, structure and properties of volatile lanthanide complexes containing amidinate ligands: application for Er2O3 thin film growth by atomic layer deposition", Journal of Materials Chemistry, (2005), 4224-4233.

Scarel, G, "Atomic layer deposition of Lu2O3", Applied Physics Letters, 85(4), (Jul. 2004), 630-632.

Schlom, Darrell G., et al., "A Thermodynamic Approach to Selecting Alternative Gate Dielectrics", MRS Bulletin, (Mar. 2002), 198-204.

Sivasubramani, P., et al., "Outdiffusion of La and Al from amorphous LaAlO3 in direct contact with Si (001)", Applied Physics Letters, vol. 86, (2005), 201901-1 to 201901-3.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Stemmer, Susanne, et al., "Experimental investigations of the stabilty of candidate materials for high k gate dielectrics in silicon based MOSFETS", In Greer et al (editors) Nano and Giga Challenges in Microelectronics, (2003), 129-150.

Thean, Aaron, et al., "Flash memory: towards single electronics", IEEE, vol. 21, Issue 4, (Oct./Nov. 2002), 35-41.

Tiwari, S., et al., "A silicon nanocrystals based memory", Appl. Physics Lett., 68, (1996), 1377-1379.

Tiwari, S., et al., "Single Charge and Confinement Effects in Nano-Crystal Memories", Applied Physics Letters, 69(9), (Aug. 26, 1996), 1232-1234.

Van Dover, R B, "Amorphous lanthanide-doped TiOx dielectric films", Applied Physics Letters, 74(20), (May 1999), 3041-3043.

Van Dover, R. B., "Amorphous lanthanide-doped TiOx dielectric films", Applied Physics Letters, 74(20), (May 17, 1999), 3041-3043.

Yuan, C L, et al., "LaAlO3 nanocrystals embedded in amorphous Lu2O3 high k gate dielectric for floating gate memory application", Electrochemical and Solid State Letters, 9(6), (2006), F53-F55.

\* cited by examiner

US 8,847,334 B2

METHOD OF FORMING LUTETIUM AND LANTHANUM DIELECTRIC STRUCTURES

CLAIM OF PRIORITY

This application is a continuation of U.S. application Ser. No. 12/837,303, filed Jul. 15, 2010, now U.S. Pat. No. 8,071,443 which is a divisional U.S. patent application Ser. No. 11/823,727, filed on Jun. 28, 2007, now U.S. Pat. No. 7,759,237, both of which are hereby incorporated by reference herein in their entirety.

TECHNICAL FIELD

This application relates generally to electronic materials configurations for storing charge. This application further relates to fabrication methods, and electronic devices in which such materials and device configurations are used.

BACKGROUND

One approach to electronic storage devices has been the use of floating gate memory cells. However, conventional floating gate devices have limitations. One limitation includes the limited potential for continued scaling of the device structure. This is due to the stringent requirements placed on the tunnel oxide layer. There is often a trade off between speed and reliability in a conventional flash gate to allow an acceptable charge transfer rate to and from the floating gate, with satisfactory charge retention. Therefore, in order to overcome the scaling limits of floating gate devices, floating gates incorporating small crystals have been introduced. The use of crystalline components in nonvolatile memory devices allows thinner injection oxides, which permits better endurance, lower operating voltages, and faster write/erase speeds.

A current challenge includes finding improved floating gate and dielectric materials. Another current challenge includes developing improved manufacturing methods that permit higher levels of device scaling, and improve device performance for given material selections. Methods are needed that provide improved properties to overcome these and other challenges. What are also needed are improved memory devices utilizing these structures to take advantage of the improved properties.

DETAILED DESCRIPTION

In the following detailed description of the invention, reference is made to the accompanying drawings that form a part hereof and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "wafer" and "substrate" used in the following description include any structure having an exposed surface with which to form an electronic device or device component such as a component of an integrated circuit (IC). The term substrate is understood to include semiconductor wafers. The term substrate is also used to refer to semiconductor structures during processing and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term insulator or dielectric is defined to include any material that is less electrically conductive than materials referred to as conductors. The term monolayer is defined as a material layer that is substantially one molecule thick. In some embodiments, one molecule includes one atom, while other molecules are comprised of several atoms. The term monolayer is further defined to be substantially uniform in thickness, although slight variations of between approximately 0 to 2 monolayers results in an average of a single monolayer as used in description below.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Figure 1A:
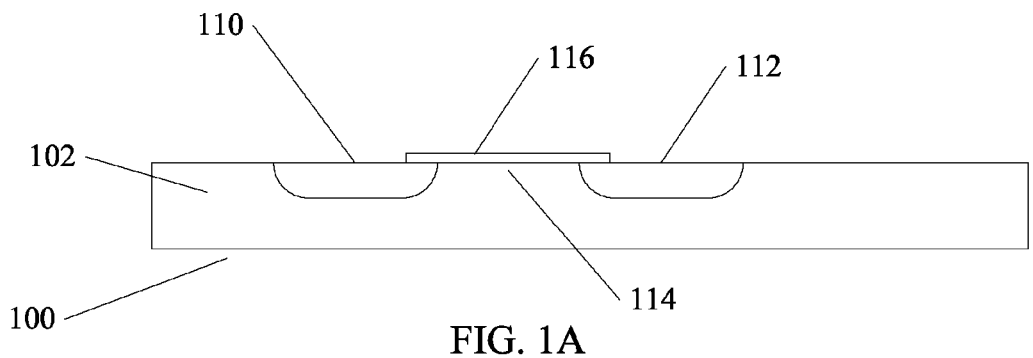
FIG. 1A-1D shows stages in a process of fabricating a dielectric structure according to an embodiment of the invention.

FIG. 1A shows a substrate surface 102 of a semiconductor layer 100 such as a silicon chip. A first source/drain region 110 is formed into the surface 102 of the semiconductor layer 100. Methods of forming source/drain regions include but are not limited to ion implantation, diffusion, deposition of doped semiconductor, etching of in situ doped layers, etc. A second source/drain region 112 is shown spaced apart from the first source/drain region 110 in the semiconductor surface 102. A channel region 114 is located between the first source/drain region 110 and the second source/drain region 112. In one example of transistor operation, the channel region 114 is selectively activated (as will be described in examples below) and current flows between the first source/drain region 110 and the second source/drain region 112.

A first layer 116 is shown formed over the semiconductor surface 102 (e.g., directly on) the channel region 114. Although the first layer 116 is shown directly adjacent to the channel region 114, the invention is not so limited. However forming directly adjacent to the channel region 114 allows for a thin first layer 116 with better electron tunneling performance, and enables formation of smaller devices such as transistors, memory cells, etc.

In one embodiment, the first layer 116 includes lutetium oxide. One example includes $Lu_2O_3$ in stoichiometric form, although other variations of lutetium oxide are included within the scope of the invention. Lutetium oxide provides a moderately high dielectric constant of around 12. A higher dielectric constant allows transfer of electrons as in an equivalent oxide thickness to silicon dioxide, while reliably maintaining an effective barrier to maintain the charge after the electrons are transferred. In one example, the first layer 116 is substantially amorphous. Among other desirable properties, amorphous materials reduce potential charge leakage that would otherwise occur though grain boundaries. In one configuration, the first layer includes a thickness of approximately 15 nanometers. This thickness provides an acceptable tunneling barrier, while concurrently providing acceptable charge retention.

Figure 1B:
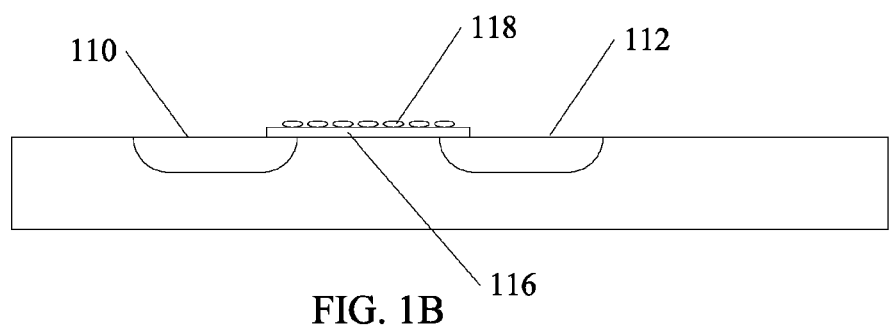

FIG. 1B shows a plurality of crystals 118 deposited on the first layer 116. In one example the crystals 118 are nanocrystals with dimensions such as average diameters on the order of nanometers. The nanocrystals in FIG. 1B include lanthanum aluminum oxide nanocrystals. Lanthanum aluminum oxide is compatible with lutetium oxide. Lanthanum aluminum oxide is thermodynamically stable on silicon under standard metal oxide semiconductor processing conditions. Standard processing conditions include temperatures in the range of 1026° C. for approximately 20 seconds. In one configuration, the plurality of crystals 118 are deposited to a thickness of approximately four nanometers. In one example, the plurality of crystals 118 do not form a continuous layer. For example, in one configuration the plurality of crystals 118 are substantially electrically isolated from each other. Electrical isolation may include physical isolation. In some examples crystals may physically touch, yet still remain substantially electrically isolated due to energetically favored charge retention within individual crystals.

Figure 1C:
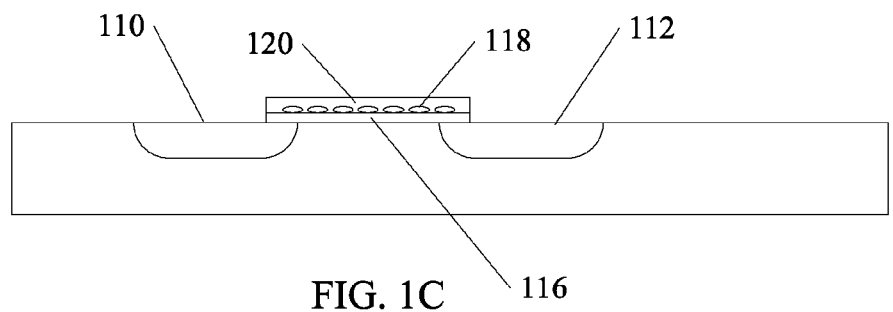

FIG. 1C shows a second layer 120 substantially covering the plurality of crystals 118. Similar to the first layer 116, in one embodiment, the second layer 120 includes lutetium oxide. One example includes $Lu_2O_3$ in stoichiometric form, although other variations of lutetium oxide are included within the scope of the invention. In one example, the second layer 120 is substantially amorphous. Among other desirable properties, amorphous materials reduce potential charge leakage that would otherwise occur though grain boundaries. In one configuration, the second layer includes a thickness of approximately 5 nanometers. This thickness provides acceptable embedding of the plurality of crystals 118 while maintaining a thin overall cross section of the device.

Figure 1D:
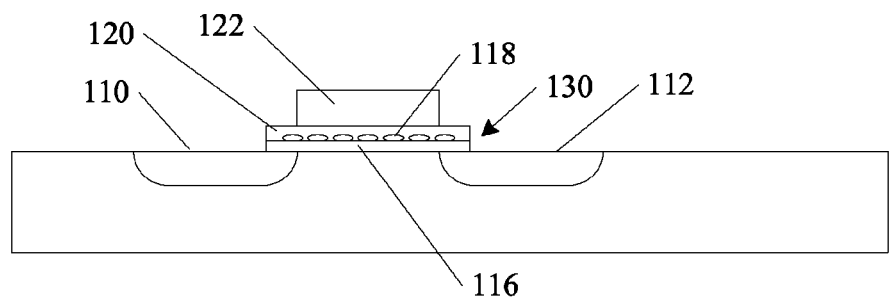

FIG. 1D shows a further step where a control gate 122 is formed over dielectric structure 130, which as shown consists of at least the first layer 116, the plurality of crystals 118 and the second layer 120. Examples of control gate materials include conductors such as doped semiconductors, metals, etc.

The dielectric structure 130 is formed using monolayer deposition methods as described in embodiments below. Methods include atomic layer deposition (ALD) techniques, chemically self-limiting techniques, or other techniques that form monolayers with controlled thickness. As defined above, the term monolayer defines a layer that is substantially one molecule or one atom thick. Although substantially one layer thick, some variation on the order of 0 to 2 molecules is within the scope of the invention.

The methods described form a unique structure compared to other deposition methods. Using monolayer deposition methods described below, a dielectric structure can be formed with step coverage over surface topography that is superior to other deposition techniques such as conventional CVD, MBE, sputtering, pulsed laser deposition etc. Selected monolayer processing methods can provide a substantially amorphous structure that is superior other deposition techniques due to low temperature deposition and chemistry control, etc. Other processing variations provide a fine crystal distribution such as a nanocrystalline structure.

Figure 2:
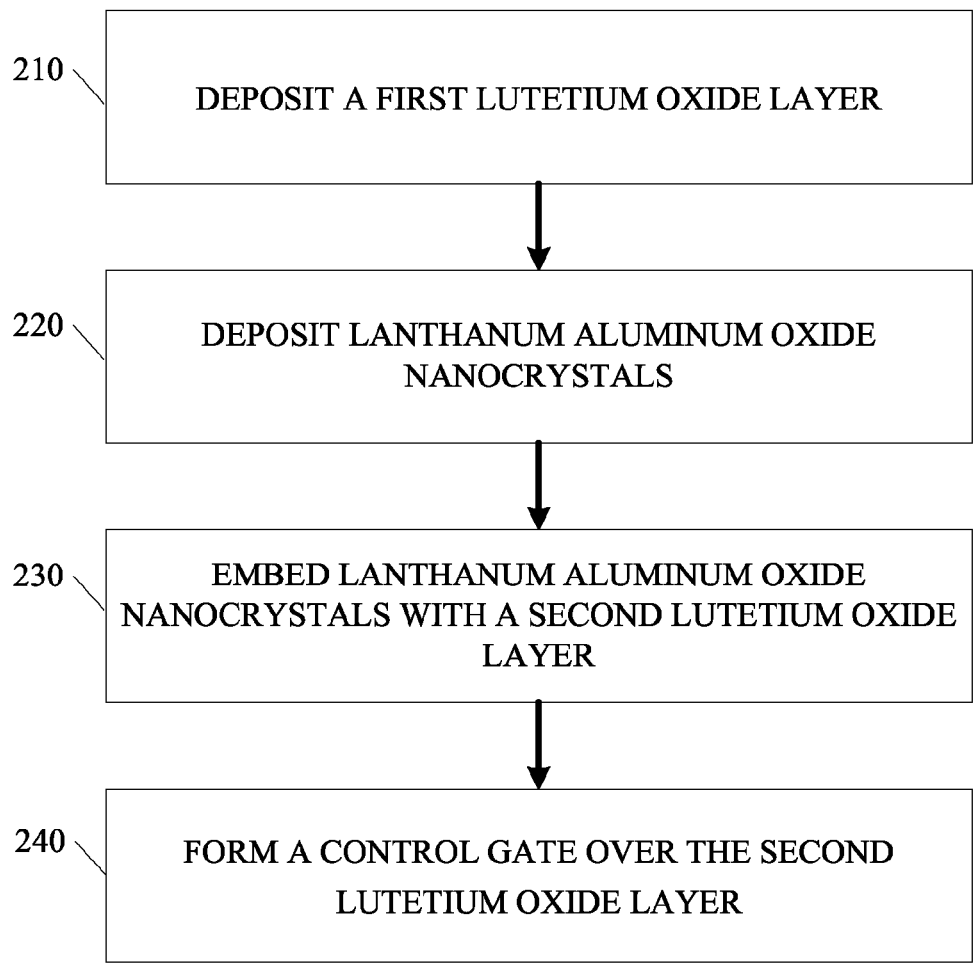
FIG. 2 shows a method of forming a material layer or structure according to an embodiment of the invention.

FIG. 2 shows a flow diagram of an example method of forming a dielectric structure according to an embodiment of the invention. In operation 210, a monolayer that includes lutetium is deposited. In one embodiment, the first monolayer is processed to form lutetium oxide. One example of lutetium oxide includes $Lu_2O_3$. As discussed above, in one example, the lutetium oxide is formed from one or more monolayers deposited individually. Using selected methods as described, monolayers can be deposited as substantially amorphous.

In operation 220, lanthanum aluminum oxide nanocrystals are deposited. One method of deposition includes individual monolayer deposition such as atomic layer deposition. Atomic layer deposition allows for good step coverage, control of nanocrystal layer thickness, and control of chemistry in the nanocrystals. In one embodiment, a monolayer that includes lanthanum is deposited, followed by a separate monolayer that includes aluminum. Further processing such as oxidation using ozone, water vapor or other oxidizers yields the lanthanum aluminum oxide nanocrystals. One example of lanthanum aluminum oxide crystals includes $LaAlO_3$. In some configurations, lanthanum aluminum oxide crystals are formed along with non-stoichiometric lanthanum aluminum oxide (represented as $La_xAl_{1-x}O_y$) or a combination of non-stoichiometric lanthanum aluminum oxide and stoichiometric lanthanum aluminum oxide. Other compounds that may be formed include lanthanum oxide and aluminum oxide such as $(La_2O_3)_x(Al_2O_3)_{1-x}$.

Selected monolayer methods described provide chemistry control through processing of individual layers that are chemically pure. For example, layers including lanthanum and aluminum can be built up to form a laminate structure. More layers can be used to form thicker structures. Further, as discussed in more detail below, the relative number of each layer can be adjusted to provide any desired ratio between lanthanum and aluminum. By using monolayer deposition, the thickness and/or the ratio between layer materials is precisely controlled.

In operation 230, the lanthanum aluminum oxide nanocrystals are embedded with a second layer of lutetium oxide. As discussed above, one method used to form lutetium oxide over the lanthanum aluminum oxide crystals includes first forming a monolayer that includes lutetium. The monolayer is then processed to form lutetium oxide. In one example, the lutetium oxide is formed from multiple monolayers deposited individually. Using selected methods as described, monolayers can be deposited as substantially amorphous.

In operation 240, a control gate is formed over the dielectric structure that includes the first lutetium oxide layer, the lanthanum aluminum oxide nanocrystals and the second lutetium oxide layer. In selected embodiments, a control gate is used to activate a channel that is adjacent to the dielectric structure. Activation of a channel region can be used in devices such as semiconductor memory devices.

As discussed above, monolayer deposition of material layers provides a number of useful properties for dielectric structures. One method of depositing monolayers includes atomic layer deposition (ALD). ALD is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favorable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for applications such as planar substrates, deep trenches, and in material deposition on porous materials, other high surface area materials, powders, etc. Examples include, but are not limited to porous silicon, alumina powders, etc. Significantly, ALD provides for controlling deposition thickness in a straightforward, simple manner by controlling the number of growth cycles.

The precursors used in an ALD process may be gaseous, liquid or solid. Typically, liquid or solid precursors are volatile. The vapor pressure must be high enough for effective mass transportation. Also, solid and some liquid precursors are heated inside the reaction chamber and introduced through heated tubes to the substrates. The necessary vapor pressure is reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other considerations for precursors used in ALD. Thermal stability of precursors at the substrate temperature is a factor because precursor decomposition affects the surface control. ALD is heavily dependent on the reaction of the precursor at the substrate surface. A slight decomposition, if slow compared to the ALD growth, can be tolerated.

The precursors chemisorb on or react with the surface, though the interaction between the precursor and the surface as well as the mechanism for the adsorption is different for different precursors. The molecules at the substrate surface react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction are typically gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse or chamber evacuation to remove excess precursor and by-products from the reaction chamber prior to pulsing the next precursor of the fabrication sequence.

Using RS-ALD, films can be layered in equal metered sequences that are essentially identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

RS-ALD provides for high continuity at an interface compared with other techniques such as CVD; conformality over difficult topography on a substrate; use of low temperature and mildly oxidizing processes; growth thickness dependent solely on the number of cycles performed, and ability to engineer multilayer laminate films with resolution of one to two monolayers. RS-ALD allows for deposition control on the order on monolayers and the ability to deposit monolayers of amorphous films.

RS-ALD processes provide for robust deposition of films or other structures. Due to the unique self-limiting surface reaction materials that are deposited using RS-ALD, such films are free from processing challenges such as first wafer effects and chamber dependence. Accordingly, RS-ALD processes are easy to transfer from development to production and from 200 to 300 mm wafer sizes in production lines. Thickness depends solely on the number of cycles. Thickness can therefore be dialed in by controlling the number of cycles.

Laminate structures of multiple layers formed using ALD can also be subsequently processed to mix the individual layers together. For example, a laminate structure can be annealed to mix a plurality of different layers together, thus forming an alloy or a mixture of layer chemistries. By forming a laminate structure using ALD, and subsequently mixing the layers, the chemistry of the resulting structure is precisely controlled. Because the laminate is made up of self-limiting monolayers over a known surface area, the number of molecules from each individual layer are known to a high degree of accuracy. Chemistry can be controlled by adding or subtracting one or more layers in the laminate.

Figure 3:
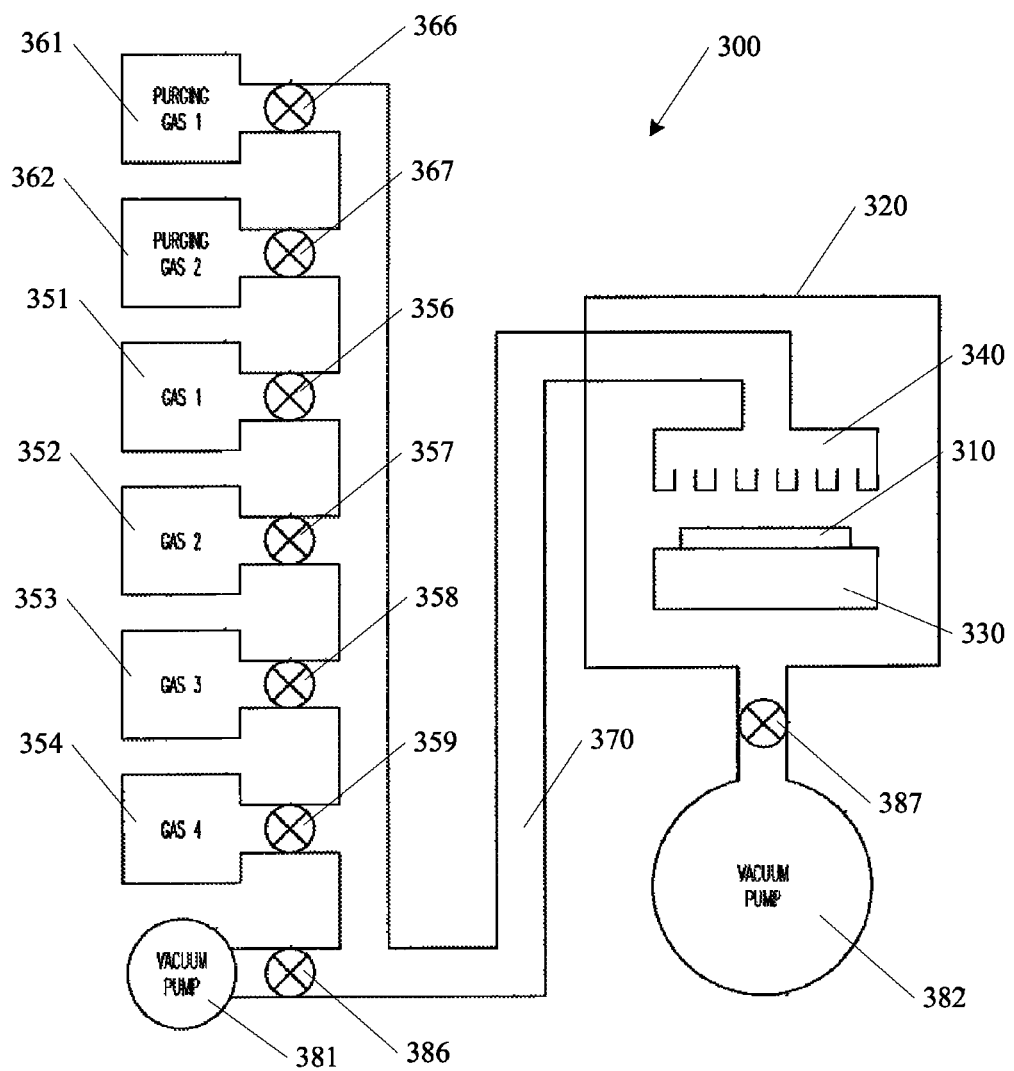
FIG. 3 shows a material deposition system according to an embodiment of the invention.

FIG. 3 shows an embodiment of an atomic layer deposition system for processing lutetium containing layers, lanthanum containing layers, aluminum containing layers, etc. In FIG. 3, a substrate 310 is located inside a reaction chamber 320 of ALD system 300. Also located within the reaction chamber 320 is a heating element 330 which is thermally coupled to substrate 310 to control the substrate temperature. A gas-distribution fixture 340 introduces precursor gases to the substrate 310. Each precursor gas originates from individual gas sources 351-354 whose flow is controlled by mass-flow controllers 356-359, respectively. The gas sources 351-354 provide a precursor gas either by storing the precursor as a gas or by providing a location and apparatus for evaporating a solid or liquid material to form the selected precursor gas.

Also included in the ALD system 300 are purging gas sources 361, 362, each of which is coupled to mass-flow controllers 366, 367, respectively. The gas sources 351-354 and the purging gas sources 361-362 are coupled by their associated mass-flow controllers to a common gas line 370, which is sometimes referred to as a gas conduit. The common gas line 370 is coupled to the gas-distribution fixture 340 inside the reaction chamber 320. Gas conduit 370 is also coupled to vacuum pump 381, which is sometimes also referred to as an exhaust pump, by mass-flow controller 386 to remove excess precursor gases, purging gases, and by-product gases at the end of a purging sequence from the gas conduit 370.

Vacuum pump 382, which is sometimes referred to as an exhaust pump, is coupled by mass-flow controller 387 to remove excess precursor gases, purging gases, and by-product gases at the end of a purging sequence from the reaction chamber 320. For convenience, control displays, mounting apparatus, temperature sensing devices, substrate maneuvering apparatus, and necessary electrical connections as are known to those skilled in the art are not shown in FIG. 3. Although ALD system 300 is illustrated as an example, other ALD systems may be used.

Using ALD methods as described above there are a number of different precursor chemistries that can be used to form monolayers including lutetium, lanthanum, aluminum, etc. One example chemistry precursor for lutetium oxide includes using a lithium 1,3-di-tera-butylacetamidinate (prepared in situ from the di-tert-butylcarbodiimide and methyllithium) in tetrahydrofuran at ambient temperature to prepare a lanthanide precursor. One suitable precursor from such a process includes Lu("BuNC(CH$_3$)N"Bu)$_3$. Properties of this example precursor include thermal stability at greater than approximately 300° C. and sublimation without decomposition at temperatures between approximately 180° C. and 220° C. in a pressure of approximately 0.05 Torr. Oxidation methods of a lutetium precursor include introduction of water vapor, ozone, or other oxidizing agent.

One example chemistry precursor method for a monolayer with lanthanum includes a β-diketonate and H$_2$S. Another example chemistry precursor method for lanthanum includes a La(EtCp)$_3$ precursor. Other examples include a La(DPM)$_3$ precursor. La(EtCp)$_3$ has a melting point of about 95° C. and has a vapor pressure that is significantly higher than the vapor pressure of La(DPM)$_3$. The use of La(EtCp)$_3$ and/or La(DPM)$_3$ as the lanthanum containing precursor may depend on the application of the electronic device being fabricated. In addition, the pulsing of the lanthanum precursor may use a pulsing period that provides uniform coverage of a monolayer on the surface or may use a pulsing period that provides partial formation of a monolayer on the surface during a lanthanum sequence.

One example chemistry precursor method for a monolayer with aluminum includes a tri-methyl aluminum (TMA) precursor. Other examples include a DMEAA precursor. The aluminum monolayers may be deposited before depositing lanthanum monolayers for forming a lanthanum aluminum oxide. In addition, the pulsing of the aluminum precursor may use a pulsing period that provides uniform coverage of a monolayer on the surface or may use a pulsing period that provides partial formation of a monolayer on the surface during an aluminum sequence. Similar to oxidation of lutetium, suitable oxidizing methods for lanthanum and aluminum include introduction of water vapor, ozone, or other oxidizing agent.

In other embodiments, a lanthanum-metal oxide monolayer may be formed in which the lanthanum-metal oxide includes lanthanum and one or more other metals. Such an oxide may be in a stoichiometric form, a non-stoichiometric form, or a combination of stoichiometric and non-stoichiometric form. The lanthanum-metal oxide made be formed by pulsing a La(EtCp)$_3$ precursor and/or La(DPM)$_3$ precursor, which is followed by pulsing a precursor containing the metal for the lanthanum-metal oxide. If multiple metal species are to be formed in the lanthanum-metal oxide, multiple monolayer sequences may be performed using a different metal containing precursor for each of the different metal species sequences.

In an embodiment, a lanthanum aluminum oxide may be formed substantially as stoichiometric lanthanum aluminum oxide such as LaAlO$_3$. In an embodiment, a lanthanum aluminum oxide may be formed substantially as a non-stoichiometric lanthanum aluminum oxide (represented as La$_x$Al$_{1-x}$O$_y$) or a combination of non-stoichiometric lanthanum aluminum oxide and stoichiometric lanthanum aluminum oxide. In an embodiment, a lanthanum aluminum oxide may be formed substantially as a compound of lanthanum oxide and aluminum oxide such as (La$_2$O$_3$)$_x$(Al$_2$O$_3$)$_{1-x}$. In an embodiment, a dielectric layer containing a lanthanum aluminum oxide layer may be formed substantially as a lanthanum aluminum oxide layer.

In one method, lanthanum aluminum oxide in one or more forms described above is further processed to form nanocrystals of lanthanum aluminum oxide. In some examples, processing of the lanthanum aluminum oxide increases a fraction of crystallinity where some degree of crystallinity was present before processing. An example of further processing includes heating to a temperature for a time such that amorphous or non-stoichiometric lanthanum aluminum oxide coverts to crystalline lanthanum aluminum oxide.

Although a number of examples of precursors, oxidizers and process conditions are listed above, the invention is not so limited. One of ordinary skill in the art, having the benefit of the present disclosure will recognize that other chemistries and process conditions that form monolayers with lanthanum, aluminum, and lutetium can be used.

Figure 4:
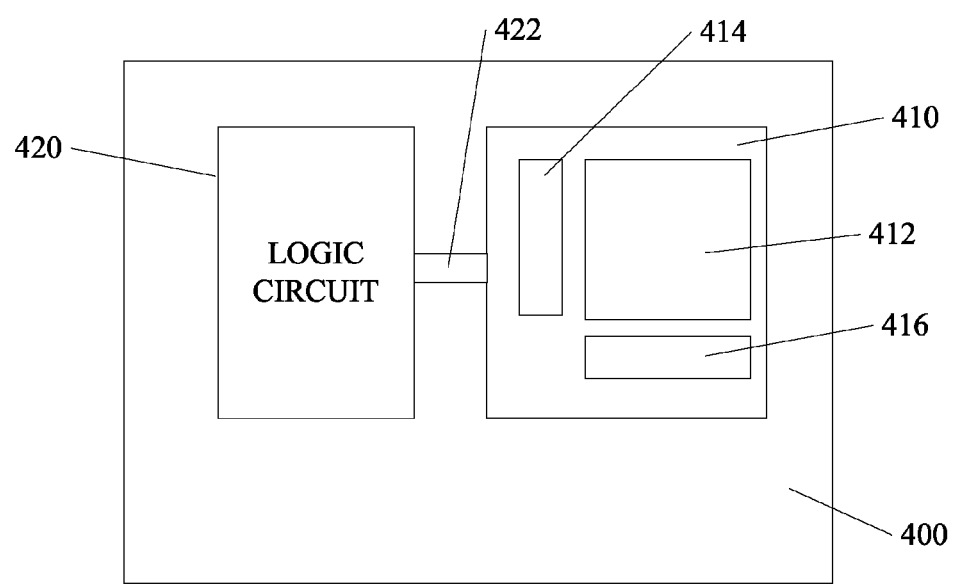
FIG. 4 shows a block diagram of an electronic device according to an embodiment of the invention.

FIG. 4 shows one specific example of an electronic device 400 including dielectric structures formed as described above. The electronic device 400 includes a memory device 410, with an array of memory cells 412. In one configuration, one or more memory cells include dielectric structures as described in embodiments above. In one embodiment the array 412 is coupled to additional row circuitry 414 and column circuitry 416. Examples of row and/or column circuitry includes drivers, amplifiers, decoders, etc. In one embodiment, the memory device 410 is formed on a single semiconductor substrate using CMOS processes.

FIG. 4 further shows a logic circuit 420 coupled to the memory device 410 through circuitry 422. In one embodiment, the logic circuit 420 includes a programmable logic circuit. Other logic circuits include microprocessors, etc. In one embodiment, the logic circuit 420 and circuitry 422 are formed on the same semiconductor substrate as the memory device 410.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description. The scope of the invention includes any other applications in which the above structures and methods are used. The scope of the invention should be determined with reference to the appended claims, along with the full scope of equivalents to which such claims are entitled.

What is claimed is:

1. A memory cell comprising:
    a dielectric structure comprising lanthanum aluminum oxide crystals embedded in a layer comprising lutetium; and
    a control gate adjacent to the dielectric structure.

2. The memory cell of claim 1, wherein the layer comprising lutetium includes lutetium oxide.

3. The memory cell of claim 1, wherein the layer comprising lutetium includes amorphous lutetium oxide.

4. The memory cell of claim 1, wherein the layer comprising lutetium includes an amorphous layer comprising lutetium.

5. The memory cell of claim 1, wherein the lanthanum aluminum oxide crystals are substantially isolated from one another.

6. The memory cell of claim 1, wherein the lanthanum aluminum oxide crystals include non-stoichiometric lanthanum aluminum oxide of the form $La_x Al_{1-x} O_y$.

7. The memory cell of claim 1, wherein the lanthanum aluminum oxide crystals include stoichiometric lanthanum aluminum oxide of the form $LaAlO_3$.

8. A memory cell comprising:
   a dielectric structure comprising lanthanum aluminum oxide crystals embedded in lutetium oxide; and
   a control gate adjacent to the dielectric structure.

9. The memory cell of claim 8, wherein the lutetium oxide is a layer approximately 20 nanometers thick.

10. The memory cell of claim 8, wherein the lanthanum aluminum oxide crystals are separated from the control gate by an approximately 5 nanometer thick portion of the lutetium oxide.

11. The memory cell of claim 8, wherein the lanthanum aluminum oxide crystals are separated from a channel region of the memory cell by an approximately 15 nanometer thick portion of the lutetium oxide.

12. The memory cell of claim 8, wherein the lanthanum aluminum oxide crystals are formed in a layer approximately 4 nanometers thick within the lutetium oxide.

13. A memory cell, comprising:
   a source region and a drain region;
   a dielectric charge storage structure coupled between the source region and the drain region, including:
      a substantially amorphous lutetium oxide region;
      a plurality of lanthanum aluminum oxide crystals within the substantially amorphous lutetium oxide region.

14. The memory cell of claim 13, wherein the plurality of lanthanum aluminum oxide crystals include a plurality of lanthanum aluminum oxide nanocrystals.

15. The memory cell of claim 13, wherein the lutetium oxide region is amorphous.

16. The memory cell of claim 13, wherein the plurality of lanthanum aluminum oxide crystals are physically isolated from each other.

17. The memory cell of claim 13, wherein the plurality of lanthanum aluminum oxide crystals are electrically isolated from each other.

\* \* \* \* \*